US010580481B1

(12) United States Patent
Sadredini et al.

(10) Patent No.: US 10,580,481 B1
(45) Date of Patent: Mar. 3, 2020

(54) METHODS, CIRCUITS, SYSTEMS, AND ARTICLES OF MANUFACTURE FOR STATE MACHINE INTERCONNECT ARCHITECTURE USING EMBEDDED DRAM

(71) Applicant: University of Virginia Patent Foundation, Charlottesville, VA (US)

(72) Inventors: Elaheh Sadredini, Charlottesville, VA (US); Gholamreza Rahimi, Charlottesville, VA (US); Kevin Skadron, Charlottesville, VA (US); Mircea Stan, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 16/246,742

(22) Filed: Jan. 14, 2019

(51) Int. Cl.
| | |
|---|---|
| G11C 11/406 | (2006.01) |
| G11C 11/4093 | (2006.01) |
| H03K 19/0175 | (2006.01) |
| G11C 11/408 | (2006.01) |
| G11C 11/4094 | (2006.01) |
| G11C 11/4091 | (2006.01) |

(52) U.S. Cl.
CPC ........ *G11C 11/4093* (2013.01); *G11C 11/406* (2013.01); *G11C 11/4087* (2013.01); *G11C 11/4094* (2013.01); *H03K 19/017581* (2013.01); *G11C 11/4091* (2013.01)

(58) Field of Classification Search
CPC .............................. G11C 17/16; H01L 27/108
USPC ................................................. 365/175, 176
See application file for complete search history.

(56) References Cited

U.S. PATENT DOCUMENTS

| | | | | |
|---|---|---|---|---|
| 10,423,182 | B2* | 9/2019 | Mosalikanti | G05F 1/625 |
| 10,497,410 | B2* | 12/2019 | Mentovich | G11C 11/4096 |
| 2002/0021686 | A1* | 2/2002 | Ozluturk | G06F 13/374 |
| | | | | 370/342 |
| 2004/0019743 | A1* | 1/2004 | Au | G06F 5/10 |
| | | | | 711/131 |
| 2006/0026342 | A1* | 2/2006 | Calvignac | G06F 13/1642 |
| | | | | 711/105 |
| 2007/0002649 | A1* | 1/2007 | Dubey | G11C 5/025 |
| | | | | 365/201 |

(Continued)

OTHER PUBLICATIONS

Fish et al., A 14.3pW Sub-Threshold 2T Gain-Cell eDRAM for Ultra-Low Power IoT Applications in 28nm FD-SOI, Feb. 14, 2019, IEEE,10.1109/S3S.2018.8640130, https://ieeexplore.ieee.org/document/8640130, Entire document. (Year: 2019).*

(Continued)

*Primary Examiner* — Michael T Tran
(74) *Attorney, Agent, or Firm* — Stanek Lemon Crouse & Meeks, P.A.

(57) ABSTRACT

A finite state machine circuit can include a plurality of rows of gain cell embedded Dynamic Random Access Memory (GC-eDRAM) cells that can be configured to store state information representing all N states expressed by a finite state machine circuit. A number of eDRAM switch cells can be electrically coupled to the plurality of rows of the GC-eDRAM cells, where the number of eDRAM switch cells can be arranged in an M×M cross-bar array where M is less than N, and the number of eDRAM switch cells can be configured to provide interconnect for all transitions between the all N states expressed by the finite state machine circuit.

18 Claims, 9 Drawing Sheets

(56) References Cited

U.S. PATENT DOCUMENTS

| | | | | |
|---|---|---|---|---|
| 2010/0257415 | A1* | 10/2010 | Lin | G11C 29/16 |
| | | | | 714/718 |
| 2013/0294136 | A1* | 11/2013 | Siau | G11C 7/04 |
| | | | | 365/66 |
| 2013/0326160 | A1* | 12/2013 | Sperber | G06F 9/30036 |
| | | | | 711/154 |
| 2015/0074373 | A1* | 3/2015 | Sperber | G06F 9/30145 |
| | | | | 712/7 |
| 2015/0234601 | A1* | 8/2015 | Tsai | G06F 3/0611 |
| | | | | 711/103 |
| 2017/0062069 | A1* | 3/2017 | Yang | G11C 16/3445 |
| 2017/0220100 | A1* | 8/2017 | DiBene, II | G06F 1/324 |
| 2017/0271010 | A1* | 9/2017 | Kajigaya | G06F 12/02 |
| 2018/0102161 | A1* | 4/2018 | Ong | G11C 5/025 |
| 2018/0113875 | A1* | 4/2018 | Jain | G06F 16/1847 |
| 2018/0173444 | A1* | 6/2018 | Marcu | G06F 3/061 |
| 2018/0285105 | A1* | 10/2018 | Wang | G06F 9/3004 |
| 2019/0042157 | A1* | 2/2019 | Bonen | G06F 3/0647 |
| 2019/0042454 | A1* | 2/2019 | Kantecki | G06F 12/0897 |
| 2019/0042909 | A1* | 2/2019 | Sumbul | G06N 3/049 |
| 2019/0042930 | A1* | 2/2019 | Pugsley | G06N 3/084 |
| 2019/0057050 | A1* | 2/2019 | Mathuriya | G06F 13/1668 |
| 2019/0101974 | A1* | 4/2019 | Guim Bernat | G06F 1/3221 |
| 2019/0104029 | A1* | 4/2019 | Guim Bernat | H04L 41/0896 |
| 2019/0130983 | A1* | 5/2019 | Singidi | G11C 11/5642 |
| 2019/0146694 | A1* | 5/2019 | Parikh | G11C 11/4072 |
| | | | | 711/105 |
| 2019/0205261 | A1* | 7/2019 | Cheriton | G06F 8/65 |
| 2019/0258769 | A1* | 8/2019 | Trujillo | G06F 17/5072 |
| 2019/0371380 | A1* | 12/2019 | Vancha | G11C 7/08 |
| 2019/0371802 | A1* | 12/2019 | Morris | H01L 28/60 |
| 2019/0379381 | A1* | 12/2019 | Lu | H03K 19/17768 |

OTHER PUBLICATIONS

Teman et al., High Density GC-eDRAM Design in 16nm FinFET, Jan. 1, 2019, IEEE,10.1109/ICECS.2018.8618019, https://ieeexplore.ieee.org/document/8618019, Entire document. (Year: 2019).*

Teman et al., A 5-Transistor Ternary Gain-Cell eDRAM with Parallel Sensing, May 4, 2018, IEEE, 10.1109/ISCAS.2018.8351360, https://ieeexplore.ieee.org/document/8351360, Entire document. (Year: 2018).*

Burg et al., A process compensated gain cell embedded-DRAM for ultra-low-power variation-aware design, Aug. 11, 2016, IEEE, 10.1109/ISCAS.2016.7527413, https://ieeexplore.ieee.org/document/7527413, Entire document. (Year: 2016).*

Teman et al., Gain-Cell Embedded DRAM-Based Physical Unclonable Function, Jun. 21, 2018, IEEE, 10.1109/TCSI.2018.2838331, https://ieeexplore.ieee.org/document/8391755, Entire document. (Year: 2018).*

Burg et al., A 4-Transistor nMOS-Only Logic-Compatible Gain-Cell Embedded DRAM With Over 1.6-ms Retention Time at 700 mV in 28-nm FD-SOI, Sep. 13, 2017, 10.1109/TCSI.2017.2747087, https://ieeexplore.ieee.org/document/8036208, Entire document. (Year: 2017).*

Dlugosch et al., "An Efficient and Scalable Semiconductor Architecture for Parallel Automata Processing," IEEE Transactions on Parallel and Distributed Systems, vol. 25, Issue 12, Dec. 2014, pp. 3088-3098.

Sadredini et al., "Frequent Subtree Mining on the Automata Processor: Challenges and Opportunities," ICS'17 Proceedings of the International Conference on Supercomputing, Article No. 4, Chicago, Illinois, Jun. 14-16, 2017, 11 pages.

Wang et al., "Association Rule Mining with the Micron Automata Processor," IPDPS '15, IEEE, 11 pages.

Wang et al., "Sequential Pattern Mining with the Micron Automata Processor," CF'16 Proceedings of the ACM International Conference on Computing Frontiers, May 16-19, Como, Italy, pp. 135-144.

* cited by examiner

| Benchmark | #Transitions | #Connected Components | Baseline #FCB | Embodiment #FCB | Embodiment #RCB | Switch Reduction (times) |
|---|---|---|---|---|---|---|
| Brill | 62054 | 1962 | 168 | 0 | 168 | 7.1 |
| Dotstar | 94254 | 2837 | 378 | 0 | 378 | 7.1 |
| EntityResolution | 219264 | 1000 | 500 | 500 | 0 | 1 |
| Fermi | 57576 | 2399 | 160 | 0 | 160 | 7.1 |
| Hamming | 19251 | 93 | 47 | 0 | 47 | 7.1 |
| Levenshtein | 9096 | 24 | 12 | 0 | 12 | 7.1 |
| PowerEN | 40271 | 2857 | 160 | 0 | 160 | 7.1 |
| Protomata | 41635 | 2340 | 165 | 5 | 161 | 7.1 |
| RandomForest | 33220 | 1661 | 139 | 0 | 139 | 7.1 |
| Snort | 81380 | 5025 | 270 | 19 | 252 | 5 |
| SPM | 211050 | 2687 | 419 | 0 | 419 | 7.1 |
| BlockRings | 44352 | 192 | 192 | 0 | 192 | 7.1 |
| Dotstar03 | 12264 | 299 | 49 | 0 | 49 | 7.1 |
| Dotstar06 | 12939 | 298 | 50 | 0 | 50 | 7.1 |
| Dotstar09 | 12907 | 297 | 50 | 0 | 50 | 7.1 |
| Ranges05 | 12472 | 299 | 50 | 0 | 50 | 7.1 |
| Ranges1 | 12406 | 297 | 50 | 0 | 50 | 7.1 |
| ExactMath | 12144 | 297 | 50 | 0 | 50 | 7.1 |
| Bro217 | 2130 | 187 | 10 | 0 | 10 | 7.1 |
| Average | 52140 | 153.63 | 153.63 | 27.78 | 125.94 | 7.1 |

METHODS, CIRCUITS, SYSTEMS, AND ARTICLES OF MANUFACTURE FOR STATE MACHINE INTERCONNECT ARCHITECTURE USING EMBEDDED DRAM

STATEMENT OF GOVERNMENT SUPPORT

This invention was made with government funds under Grant No. HR0011-18-3-0004 awarded by the Department of Defense/Defense Advanced Research Projects Agency (DARPA). The government has certain rights in the invention.

FIELD

The present invention relates to the field of electronics in general, and more particularly, to programmable electronic circuits.

BACKGROUND

Pattern matching may be used in many big-data applications such as network security, machine learning, and genomics. One leading methodology for pattern matching is to use regular expressions or equivalent finite state machines to identify a pattern in a large dataset. A regular expression can be represented by a deterministic finite automata (DFA) or non-deterministic finite automata (NFA), which can be equivalent in computational power.

On CPUs, NFAs and DFAs may be represented by tables where each state's successor state(s) can be indicated in response to a rule match. DFAs may be the basis for implementing automata on CPUs, because they may have more predictable memory bandwidth requirements. An NFA may have many active states and may use many state lookups to process a single input symbol (which may require significant memory bandwidth), whereas a DFA may utilize a single state. On the other hand, because DFAs may exhibit an exponential increase in the number of states relative to NFAs, DFA tables may be too large to store in a processor cache.

Graphics processing units (GPUs) may provide more parallel resources, which may reduce DRAM access latency. However, highly-random access patterns in automata processing may exhibit poor memory locality, which may increase branch divergence and the need for synchronization. Therefore, off-the-shelf von Neumann architectures have struggled to meet the processing requirements of many of the big-data applications described above.

"Spatial" hardware accelerators have been employed in this area as the performance growth in conventional processors has slowed. Spatial hardware accelerators for automata processing, such as automata processors and Field Programmable Gate Arrays, can be used to layout reconfigurable hardware resources on a substrate based on rules or instructions provided to the FPGA, which may allow more patterns to searched in parallel.

The Micron Automata Processor developed by Micron Technologies (AP) and Cache Automata (CA) provide spatial automata acceleration using DRAM and SRAM arrays, respectively. Both of these spatial processors can allow native execution of non-deterministic finite automata (NFAs), an efficient computational model for regular expressions, and may process a new input symbol every cycle. In particular, the AP repurposes DRAM arrays for the state-matching and has a deeply hierarchical routing matrix whereas the CA re-purposes the last-level cache for the state-matching with 8T SRAM cells used for the interconnect. CA uses a full-crossbar topology for the interconnect to support full connectivity in an automaton.

SUMMARY

Embodiments according to the present invention can provide methods, circuits, systems, and articles of manufacture for state machine interconnect architecture using embedded DRAM. Pursuant to these embodiments, a finite state machine circuit can include a plurality of rows of gain cell embedded Dynamic Random Access Memory (GC-eDRAM) cells that can be configured to store state information representing all N states expressed by a finite state machine circuit. A number of eDRAM switch cells can be electrically coupled to the plurality of rows of the GC-eDRAM cells, where the number of eDRAM switch cells can be arranged in an M×M cross-bar array where M is less than N, and the number of eDRAM switch cells can be configured to provide interconnect for all transitions between the all N states expressed by the finite state machine circuit.

In some embodiments, a finite state machine circuit can include a plurality of rows of gain cell embedded Dynamic Random Access Memory (GC-eDRAM) cells configured to store state information representing all N states expressed by a finite state machine circuit. A number of eDRAM switch cells can be electrically coupled to the plurality of rows of the GC-eDRAM cells, where the number of eDRAM switch cells can be about 7 times less than N2 wherein the number of eDRAM switch cells configured to provide interconnect for all transitions between the all N states expressed by the finite state machine circuit.

In some embodiments, a finite state machine circuit can include a plurality of rows of embedded gain cell Dynamic Random Access Memory (GC-eDRAM) cells configured to store state information representing all N states expressed by a finite state machine circuit in a first state machine operational mode and to provide interconnect for all transitions between the all N states expressed by the finite state machine circuit in a second state machine operational mode.

BRIEF DESCRIPTION OF THE DRAWINGS

FIG. 11 is a table of experimental data that illustrates the effect of RCB interconnect design on the overall switch utilization in some embodiments.

DETAILED DESCRIPTION OF EMBODIMENTS ACCORDING TO THE INVENTION

Figure 2:
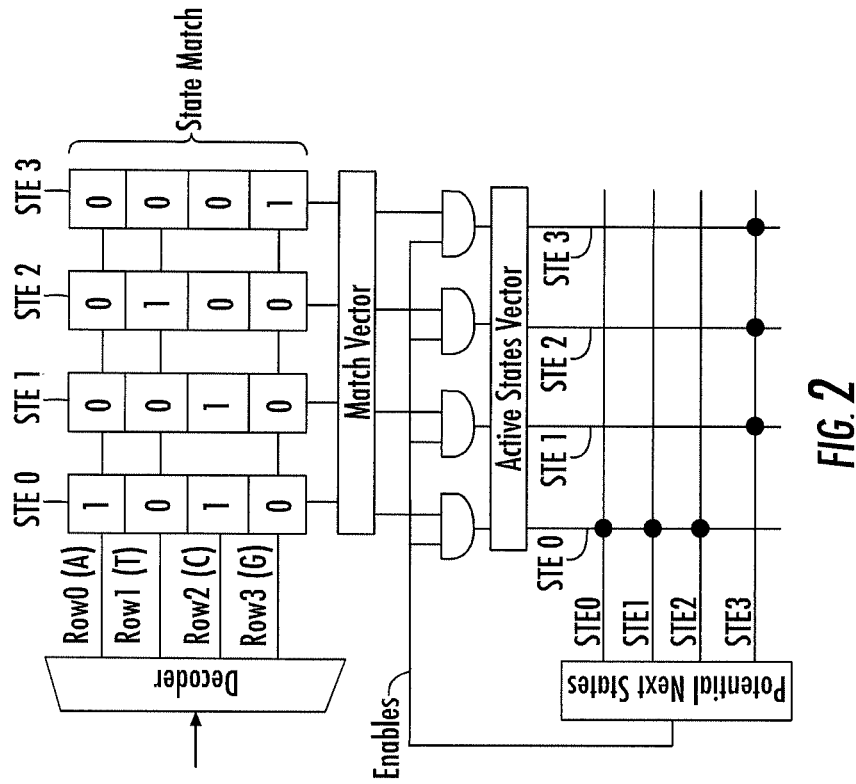
FIG. 2 illustrates operations of a two level pipelined state machine architecture used for pattern matching using the state information for all of the states expressed by the state machine of FIG. 1 stored in rows of DRAM and an interconnect (as a cross-bar array) of switches that are configured to carry out all of the state transitions expressed by the state machine.

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

In some embodiments according to the present invention, a compact, low-overhead, and flexible interconnect architecture can be used to route next-state activation, which can provide a significant reduction in the switches that are needed to implement a cross-bar switch to provide the next-state activation. Moreover, the architecture can be applied to the existing in-memory automata processing architectures. For example, the interconnect architecture of Cache Automata or the Automata Processor can be optimized with the present approach. In some embodiments, implementations can provide an improvement of about 5.1 times to about 207 times better throughput per unit area compared to the Cache Automata and Micron's Automata Processor implementations respectively, as well as lower power consumption and better scaling.

It will be understood that eDRAM refers to dynamic random-access memory (DRAM) integrated on the same die or multi-chip module (MCM) of an application-specific integrated circuit (ASIC) or processors (such as those used to implement the state machines described herein in some embodiments). An eDRAM cell uses substantially fewer transistors and has lower leakage current than an SRAM cell. This reduced leakage current can reduce the power used to retain data compared to the static leakage power of a corresponding SRAM cell.

It will be further understood that a Gain Cell embedded DRAM (GC-eDRAMs) includes 2-3 standard logic transistors and optionally an additional MOSCAP or diode. Three-transistor (3T) and two-transistor (2T) GC-eDRAMs may be beneficial in providing 1) a fast read cycle time, and 2) non-destructive read where stored data is maintained subsequent to a read operation and, moreover, a re-write operation may not be necessary.

In some embodiments, at least 7 times fewer switches may be required to implement a reduced cross-bar interconnect using for example 2T1D eDRAM cells as the switches in the reduced cross-bar (RCB) array compared to the full crossbar design used, for example, in CA. Accordingly, as appreciated by the present inventors, a full-crossbar interconnect may be inefficient as many of the switches may be unused.

In some embodiments, 2T1D (two transistor one diode) memory cells are used as the switches. The use of the 2T1D memory cells (rather than a 1T1C—one transistor one capacitor cell used in conventional DRAM and eDRAM memories) takes advantage of the feature that 2T1D cells provide non-destructive read operations which (because the need for a re-write operation is removed) allows a wire OR operation within the interconnect cross-bar for an efficient automata processing interconnect design. Moreover, a 2T1D cell may use substantially fewer transistors than a 8T SRAM cell.

As appreciated by the present inventors, a diverse set of benchmarks shows that congestion in the routing matrix can reduce efficient state utilization (which can be about 64%), and can be significantly less (e.g., about 13%) especially for difficult-to-route state machines. Accordingly, this low state utilization can mean that a large portion of a DRAM chip area that is allocated to the interconnect may be unused.

As further appreciated by the present inventors, CA implementation may use a full-crossbar topology for the interconnect to support full connectivity in a state machine. Accordingly, a full crossbar of size 256 would be implemented with 2562 interconnect as part of the interconnect so that any state can transition to any other state. However, only a low percentage, such as 0.53%-1.15%, of the switches may actually be required during operation state machine and, therefore, a full cross-bar may be inefficient compared to some embodiments according to the invention.

Figure 1:
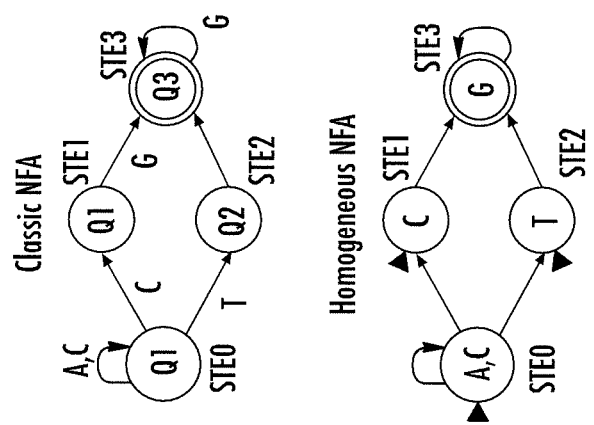
FIG. 1 illustrates schematic representations of a classic NFA state machine and a homogeneous NFA state machine.

FIG. 1 illustrates schematic representations of a classic NFA state machine and a homogeneous NFA state machine. FIG. 2 illustrates operations of a schematic representation of a two level pipeline architecture of state machine used for pattern matching using the state information for all of the states expressed by the state machine of FIG. 1 stored in rows of eDRAM and an interconnect (as a cross-bar array) of switches that are configured to carry out all of the state transitions expressed by the state machine.

According to FIG. 1, an example of a classic NFA state machine and its equivalent homogeneous representation are shown. Both state machines receive the language (A|C)* (C|T)(G)+ and the alphabets are A, T, C, G. In the classic representation, the start state is q0 and accepting state is q3. In the homogeneous NFA, states are labeled STE0-STE3, where the potential starting states are STE0, STE1, and STE2, and the accepting state is STE3. It will be understood that any state can be a starting state without incurring additional overhead.

According to FIG. 2 memory columns are configured based on the homogeneous example in FIG. 1 for STE0-STE3. Generally, state machine processing involves two steps for each input symbol: 1) state match and 2) state transition. In the state match step, the input symbol is decoded and the set of states whose rule or label matches that input symbol are detected by reading a row of memory to provide a match vector. Then, the set of potentially matching states is combined with the active-state vector, which indicates the set of states that are currently active and allowed to initiate state transitions; i.e., these two vectors are ANDed together. In the state-transition phase, the potential next-cycle active states are determined for the current active states (active state vector) by propagating signals through the interconnect to update the active state vector for the next input symbol operation.

According to FIG. 2, each of the four rows of DRAM memory is mapped to one label (i.e., A, T, C, and G). Each state in the NFA example is mapped to one memory column, with '1' in the rows matching the label(s) assigned to those STEs. STE0 matching symbols are A and C. In operation, if STE0 is a current active state then the potential next cycle active states (or enable signals) are the states connected to STE0, which are STE0, STE1, and STE2 (the enable signals for STE0, STE1, and STE2 are '1' as indicated by the bolded portions of the interconnect). Specifically, if the input symbol is 'C,' then the Row 2 is read into the match vector. A bitwise AND operation is performed on the match vector and the potential next states (enable signals) determines STE0 and STE1 as the current active states.

Figure 3:
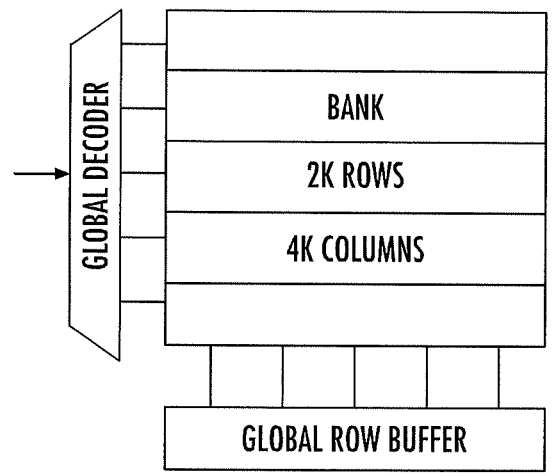
FIG. 3 illustrates a memory bank architecture in which operations illustrated in FIG. 2 may be carried out using the reduced cross-bar interconnect and reconfigurable eDRAM as described in some embodiments herein using a state match phase and a state transition phase.

FIG. 3 illustrates a memory bank architecture in which operations illustrated in FIG. 2 may be carried out using the reduced cross-bar interconnect and reconfigurable eDRAM as described in some embodiments herein using a state match phase and a state transition phase.

According to FIG. 3, to support multiple memory requests in parallel, DRAM systems can provide multiple banks, where each bank can be accessed independently. As shown in FIG. 3, an eDRAM bank abstraction where one eDRAM bank includes 8 Mb (2k rows and 4k memory columns) based on eDRAM used in, for example, a 4th-generation Core processor marketed by Intel. In order to connect all the rows in a bank to the global row-buffer directly, long bitline wires are formed, which may increase DRAM access latency due to the large parasitic capacitance. Moreover, if two memory requests map to two different rows in a bank, then the memory requests are processed serially due to a conflict.

Figure 4:
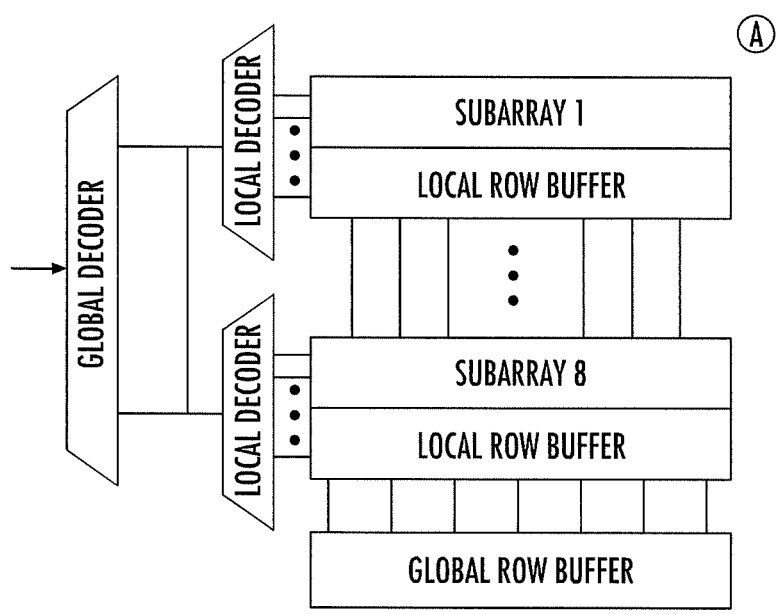
FIG. 4 is a block diagram illustrating eDRAM banks including multiple subarrays with dedicated local row-buffers and small changes in the global decoder.

However, as shown in FIG. 4, the eDRAM banks includes multiple subarrays with dedicated local row-buffers and with small changes in the global decoder, more than one row can be accessed by reducing the shared resources and enabling activation of different subarrays in parallel. Therefore, activation and precharging can be done locally within each subarray. Accordingly, in some embodiments according to the invention, subarray-level parallelism may be utilized for the state-matching and state-transition phases in automata processing in order to match an input symbol with multiple automata in parallel. Accordingly, this memory bank implementation may help reduce memory latency. Moreover, this architecture may also be used to implement a global full cross-bar circuit in sub-arrays as highlighted in FIG. 5.

Referring to FIG. 1, in each cycle of state matching, all the states that are sensitive to the current input symbol are identified. To achieve this symbol-based indexing mechanism, NFA state-matching rules (i.e. state information) is stored in the columns show that span the rows of the eDRAM. Each column corresponds to one homogeneous NFA state and its matching rules. For optimal eAP density for byte-oriented processing, each subarray should include 256 rows. Within one column, each entry indicates whether that state matches a given 8-bit symbol.

In the automata processing mode, the input symbol is used as the row-address. The entire row corresponding to that symbol is read to the row buffer, to provide a vector of all the states accepting the input symbol, i.e. the Match Vector in FIG. 1. This arrangement A is shown in FIG. 2 and corresponds to the sub-arrays shown in FIG. 5.

In some embodiments according to the invention, an eDRAM bank supports two modes 1) normal mode and 2) state machine mode. In normal mode, the eDRAM bank stores data for use in other than state machine mode. During the normal mode, the global decoder only selects one of the connected subarrays based on the input address, and then, selects one row within the subarray. In state machine mode, all the local decoders receive the same address from the global decoder and decode the same row in each subarray in parallel based on the input symbol. In addition, there is no need for column addressing because all the local row-buffers (providing the match vector) are read and provided to the state transition stage. The state information can be stored as STE in the memory columns at context-switch time in normal mode.

Referring again to FIG. 2, the second stage of the pipeline is implemented as a reduced cross-bar array using switches in a reconfigurable routing design in some embodiments according to the invention. Each interconnect block is coupled to a subarray in the APU of FIG. 5 that can be configured to store the state match information that provides the match vector to the interconnect pipeline.

Conventionally, a full cross-bar switch interconnect topology may be used to connect STEs in a state machine, where every state is connected to every other state (including itself) using N2 switches where N is the number of states in the state machine. To model transitions from multiple STEs to one STE, the output is connected to multiple inputs. This is equivalent to logically ORing the active inputs (e.g., in FIG. 1, STE3 is a potential next state if the active state is either STE1, STE2, or STE3). As an example, the Cache Automata described herein uses a full cross-bar switch interconnect topology for both local and global switches.

As appreciated by the present inventors, however, the interconnect for many NFA state machines may not require all of the transitions that are enabled by a full cross-bar switch. Accordingly, in some embodiments, all of the transitions of a state machine circuit can be provided with a reduced cross-bar (RCB) interconnect, which has fewer switches than a full cross-bar (FCB) interconnect.

Figure 5:
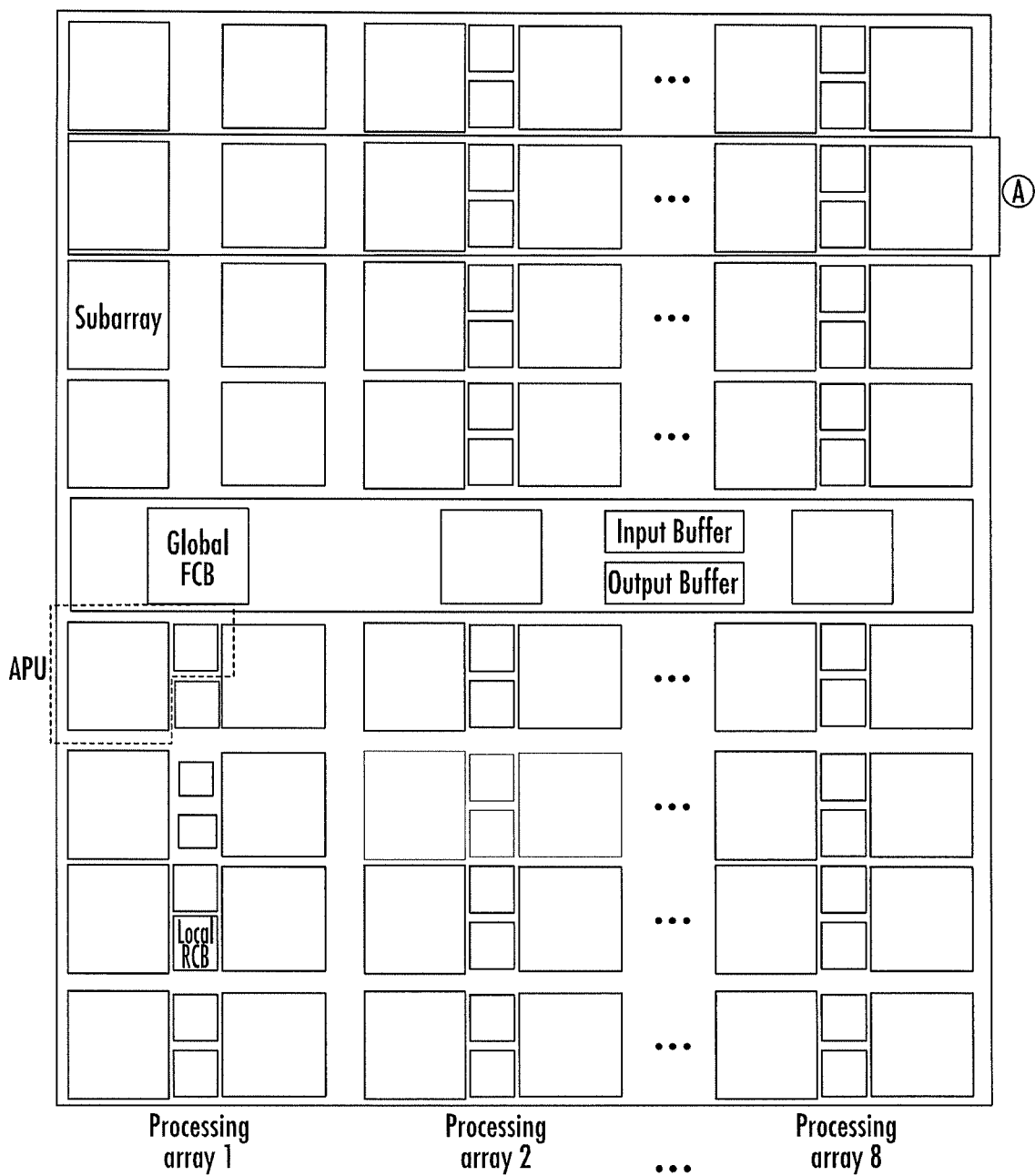
FIG. 5 shows a general overview of a bank implemented in an exemplary state machine in some embodiments.
Figure 6:
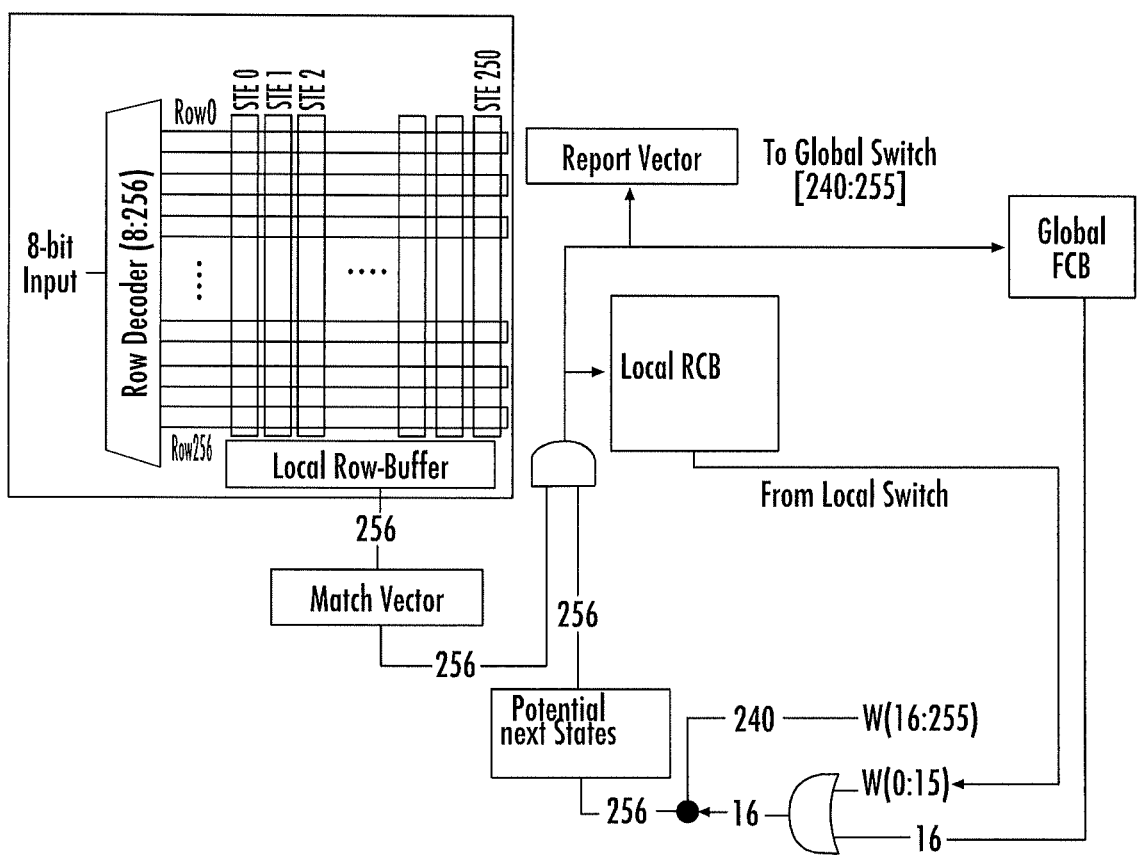
FIG. 6 shows a detailed view of the highlighted portion of FIG. 5 in some embodiments.
Figure 7A:
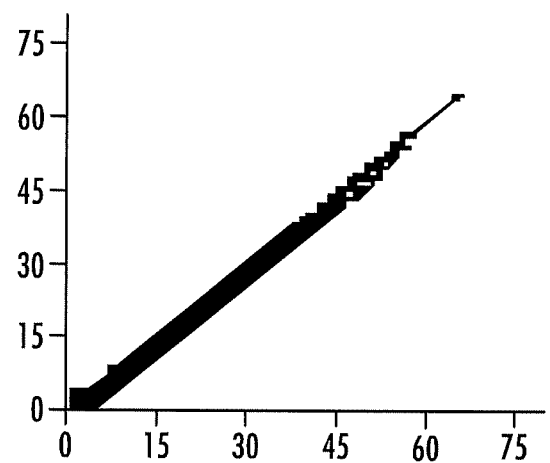
FIGS. 7A-7E are graphs of simulation results showing the union over all connectivity images for connected components in one benchmark providing a visualization of the connectivity matrix for the state machine in each benchmark with an image.
Figure 7B:
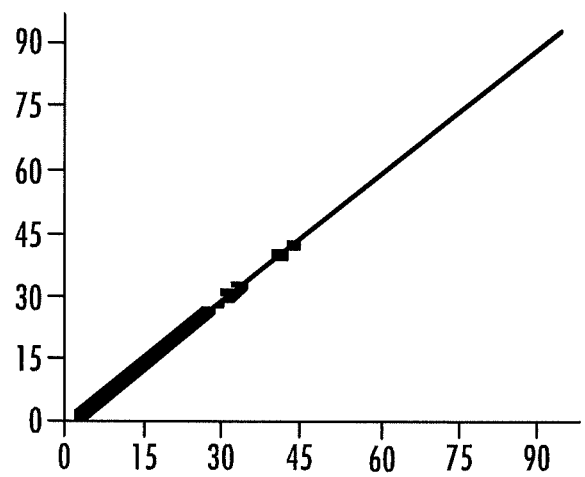
Figure 7C:
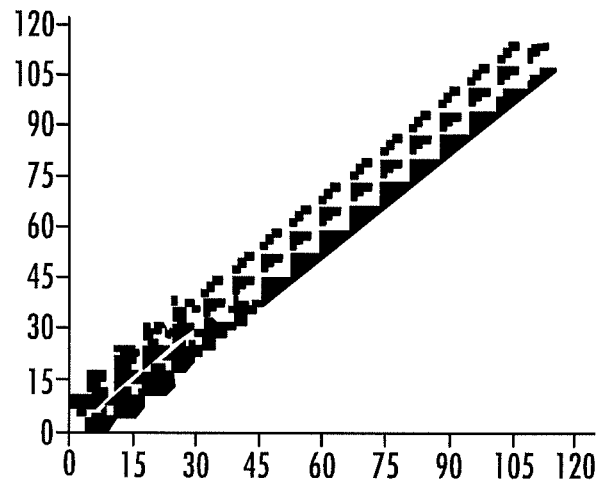
Figure 7D:
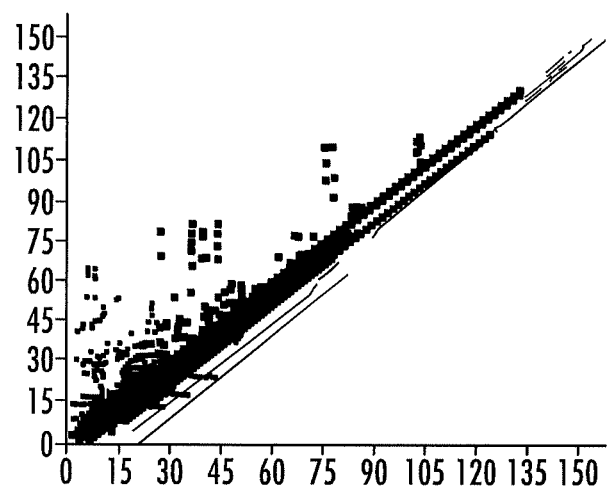
Figure 7E:
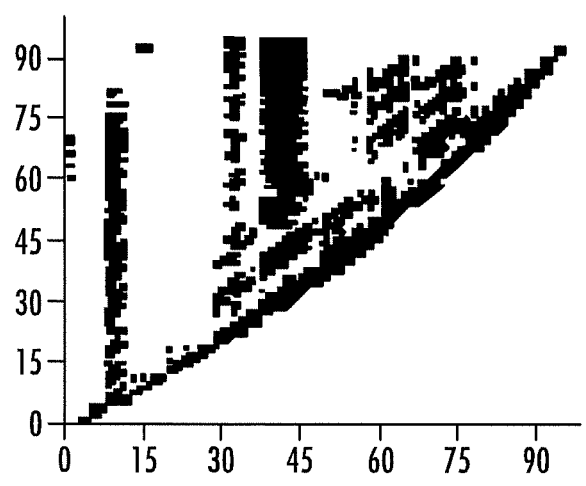

FIG. 5 shows the general overview of a bank implemented in an exemplary automata processor (AP) in some embodiments. Each bank has eight columns of automata processing arrays (APA) with maximum capacity of 4096 STEs each. Each APA consists of eight tiles and each tile contains two automata processing units (APUs). Each APU hosts a memory subarray of 256×256 for state matching and a RCB subarray with aggregate size of 256 nodes as local interconnect. FIG. 6 shows a detailed view of the highlighted portion of FIG. 5 in some embodiments.

Inside each APA, tiles are stacked to work collaboratively through a global switch (FCB of size 256×256) to process larger connected components that do not fit in a single APU. The global FCB switch allows 16 states in each APU, called port nodes (PNs), to communicate with all PNs of different APUs in the same APA. Global FCB has positioned in the middle of APA to minimize the longest required wire to/from bottommost and topmost APUs.

Each APU individually supports RCB interconnects to maximize state capacity in the bank, but for uncommon cases that a connected component does not fit into an RCB interconnect, eAP can reconfigure the state matching subarrays as FCB interconnects. Specifically, this automata processing element (one in a tile) can combine the state-matching subarray of one of the APUs in the tile (as a full crossbar interconnect) and the state-matching of the other APU in the same tile. This approach can halve that state capacity of the contributed tile but provides ability to accept connected component without any limitation on interconnect shape. To support this functionality, an array of 2-1 multiplexers is added for one of the subarrays in a tile (less than 2.5% area over head in 28 nm technology). This reconfiguration promotes a tile to embed any connected component (with size less than 256) plus having 32 PNs to communicate with other APU in the same APA to provide more flexible interconnect topology in a column.

FIGS. 7A-7E are graphs of simulation results showing the union over all connectivity images for connected components in one benchmark providing a visualization of the connectivity matrix for the state machine in each benchmark with an image. In collecting the data, each node in a state machine was labeled with a unique index using breadth first search (BFS) numeric labeling, as BFS assigns adjacent indices to the connected nodes. In rendering the image, the edge transition model was used between two nodes (with indices i and j) in an state machine with a pixel at coordinate (i,j). In most cases (except in (7D and 7E), the rest of the benchmarks (17 out of 19) represent a diagonal connectivity property. This diagonal shaped connectivity, is derived from two properties: the numeric BFS labeling tries to label a child node closely to its parent(s); and CCs are mostly tree-shape graphs with short cycles where the nodes have a small out-degree. As appreciated by the present inventors, a reduced crossbar interconnect (RCB), has switch patterns similar to what is shown in the union images. Accordingly, in some embodiments, an RCB may have a smaller area overhead, lower power consumption, and smaller delay compared to an FCB.

According to FIGS. 7A-7E, by forcing a maximum fan-out M on the nodes in a state machine, it can be established that there is no black pixel (i.e., no need for a switch) below the line $Y=1M(X)$. RCB interconnect can be also applied to CA or AP without reducing the computation power.

In normal mode, RCB bitcells (in the sub-array of FIG. 5, for example) can be reconfigured for reliability by storing a full subarray's error-correcting code (ECC) to increase performance by using an error correction ability to tolerate bit errors due to late refresh and consequently increasing eDRAM availability time. In some embodiments, when the RCB is in NM mode, the RCB can be used as cache for full subarrays in the same APU. In some embodiments, the RCB can have smaller bit-lines due to area compression and which may provide a shorter memory access cycle.

Figure 8:
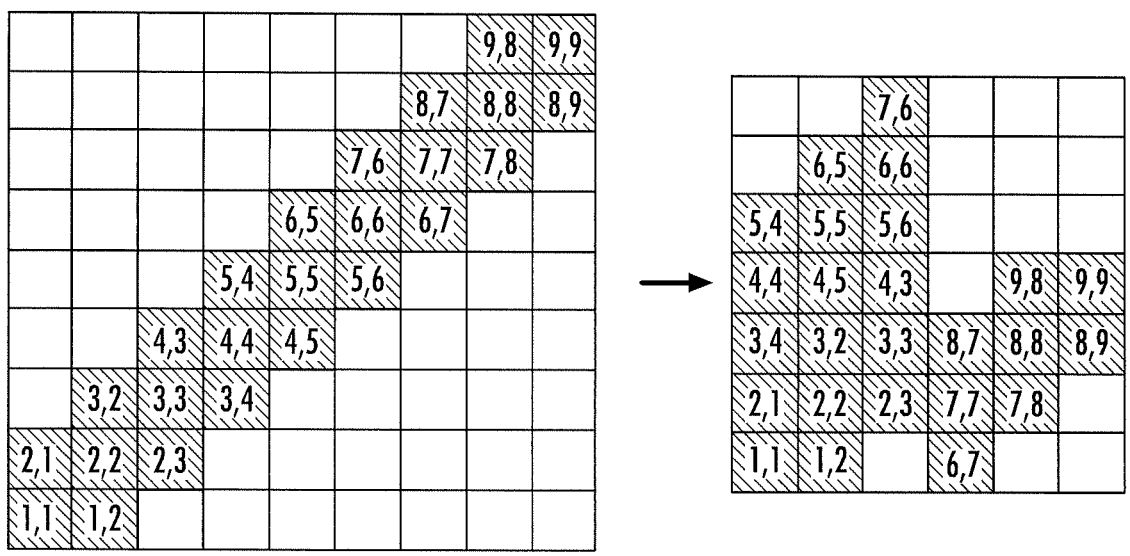
FIG. 8 is a schematic representation of an interconnect implemented as a FCB array and as an equivalent RCB array in some embodiments.

FIG. 8 shows an of example of an cross-bar array subarray of size (9,9) with diagonal width of 3 and a corresponding reduced cross-bar array implementation that supports the same state transactions as those supported by the full crossbar array. In each square, the first index shows the row-index and second one shows the column index. For example, a switch in the location (4,3) shows that the input signal comes from a STE labeled 4 (in BFS) and it is connected to a STE labeled 3. The left block shows the initial naive mapping of diagonal memory cells, while all the white regions are the wasted areas (or switches). The right block shows how moving nearby memory cells close to the lower left side can reduce 9×9 array to 7×6. The RCB placement provides that wire counts are increased to a maximum of 3 times in each row and column compared to the FCB placement. For example, in row 4 of RCB, there are two input signals (word-line signal), 2 and 9, and in column-3, there are two output signals (bitline signal), 3 and 6. Our calculation shows that an FCB of size 256×256 and diagonal width 21 can be reduced to a RCB of size 96×96, which results in approximately 7×area saving. Experimental data shows that the diagonal width of 21 is a safe margin to accommodate all the transitions (except in FIGS. 7D and 7E).

One of the issues in the physical implementation of some embodiments according to the invention, is routing congestion. It is estimated that a maximum of 3× congestion in both horizontal and vertical routing, i.e., 3 wires should fit in the area assigned for 1 wire in FCB scheme. To address issues raised by the 3× congestion, the wires may be routed in higher metal layers in some embodiments. Most modern CMOS fabrication processes allow for around 10-12 metal layers. Hence, routing may be de-congested using higher metal layers with negligible performance loss. In some embodiments, multi-patterning may be used to reduce congestion. In particular, a layout wire in a single metal layer can be provide using multiple exposures of the same metal layer to form wires at smaller widths and pitch. Hence, using multi-patterning, higher wire density can be provided at each metal layer which can reduce routing congestion.

Figure 9:
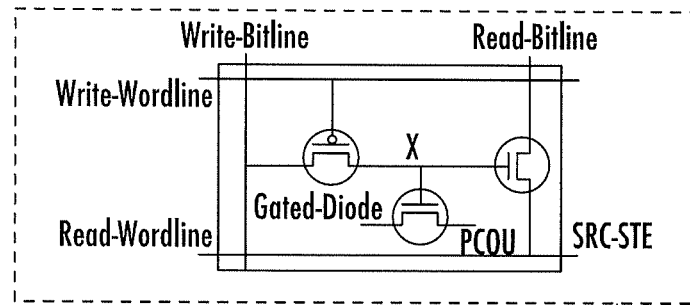
FIG. 9 is a schematic diagram of an eDRAM 2T1D switch transistor used to implement in the RCB array shown in FIG. 8 in some embodiments.
Figure 10:
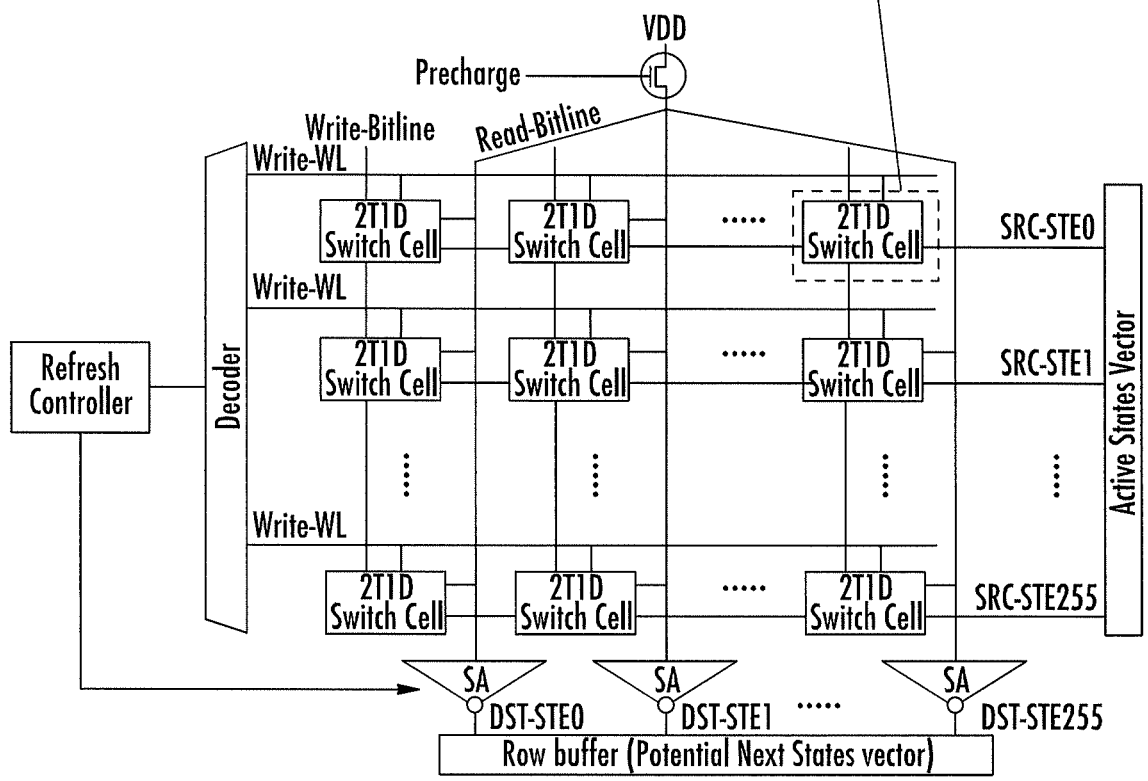
FIG. 10 is a schematic diagram of an eDRAM interconnect implemented as an RCB array in some embodiments.

In some embodiments, a 2T1D (2 transistors and 1 diode) switch cell, which is a GC-eDRAM, as the reconfigurable switch in the routing matrix as shown in FIG. 10. The 2T1D DRAM cell holds the connectivity value in the switch bar, which is '1' if the switch is connected and '0' if it is disconnected. Connected switch demonstrates an existing transition between two STEs in a state machine. FIG. 9 shows the details of 2T1D cell. The cell itself includes a PMOS transistor for write operations, an NMOS for read operations, and an N-Type Gated-Diode (NC) to reduce the coupling effect.

The N-Type Gated-Diode is layout-efficient compared to P-Type and reduces coupling noise from the adjacent cells, couples up Read-Wordline (RWL) signal in read operations (increase read frequency) and couples down the Write-WorldLine (WWL) signal in write operations (which may be important when writing '0' to the cell).

The 2T1D cell is used as a switch and has two modes: write-mode and routing-mode. According to FIG. 9, during the write-mode, Write-Worldline is '1' and Write-Bitline data is stored in the node "X". Write-Bitline value controls a switch to be connected or disconnected. Write-Bitline is VDD for the connected switch and GND otherwise. During the routing-mode, it is determined whether there is a transition between a source STE (active state) and a destination STE (potential next state). If the switch is connected and the source STE is in an active state (SRC-STE='1'), then Read-Bitline is discharged. Therefore, the sense amplifier connected to the Read-Bitline will sense '0' (and '1' after a NOT gate).

In some embodiments, using 2T1D cell allows a wired-OR function (of the data output from multiple cells) without affecting the data stored in node X as shown in FIG. 9. This feature is provided because the right-most transistor in FIG. 9 act as a switch and allow the cell to drive the bitline only when the cell holds one and the input bit (active state vector) is one. which is not provided by the structure and function of a conventional 1T1C DRAM, since a wired-OR would destroy the data stored in every node participating in the OR operation. Moreover, cells can be refreshed using the decoder and Write-Bitlines.

In addition, having a separate port for read and write makes it possible to perform write and read operations in different rows of one subarray simultaneously. This feature allows the system to keep processing inputs while writing a new set of configuration bits in the empty rows of the same subarray to initiate a new state machine.

FIG. 10 illustrates an RCB switch array implementing the interconnect using the device illustrated in FIG. 9 in some embodiments. In particular, FIG. 10 represents a 256×256 crossbar switch. The input is the active states vector (see FIG. 1 where entry '1' in the vector represents that the corresponding STE is active and entry '0' represents that the corresponding STE is inactive. The output is the potential next state vector, which is all the successor states to the current active states. A destination STE become '1' (meaning it is a potential active STE for the next symbol) if at least one of the source STEs connected to it is in the active state.

A column array of 2T1D switch cells implements a wired NOR. The inputs of NOR are the source STEs that have connection to the corresponding destination STE. For example, if both SRC-STE0 and SRC-STE1 are connected to DST-STE0, and SRC-STE1 is active in the current state, then Write-Bitline in the first column discharges. It means the sense amplifier will sense '0' and the NOT gate will generate '1'. As a result, DST-STE0 will be triggered as the potential next state of SRC-STE1.

FIG. 11 is a table of experimental data that illustrates the effect of RCB interconnect design on the overall switch utilization in some embodiments. According to FIG. 10, the second column shows the number of transitions for each dataset. Each transition maps directly to one switch point in the crossbar switch model. # FCB in the third column shows the number of used full-crossbar blocks (both local and global switches) for each dataset in CA interconnect model. To calculate the number of switch blocks in eAP, the compiler iterates over the connected components (CCs) and checks if they can fit in a RCB switch block. If not, a FCB switch is needed to accommodate connectivity. In Entity Resolution, there are many long distance loops, and none of the CCs can fit in the RCB switch block (see FIG. 3). In Snort, eAP accommodates most of the CCs in RCB switches (only 19 FCB and 256 RCB), whereas CA uses 270 FCB. We see that in eAP, 16 out 19 benchmarks are mapped to RCB switch blocks and no FCB interconnect is needed.

Levenshtein is a difficult-to-route automata. The AP compiler can fit this benchmark in an AP chip with 48K states. However, the total number of states in Levenshtein is 2784. This implies that much of the STE and interconnect resources of an AP chip are wasted in order to deal with the routing congestion. However, in our interconnect model, we just need 12 RCB switches (9% routing resources of a eAP bank and 0.07% of routing resources on eAP 128 banks) to accommodate all the automata in Levenshtein.

The utilization numbers are calculated by dividing the number of transitions in each benchmark over the number of used switches in CA and eAP architectures. For example, the number of switches used in one FCB is 256×256 and one RCB is 96×96. Imp. column shows the percentage of reduction in the number of routing switches needed to accommodate transitions for each benchmark. For example, in Brill, CA requires 168×256×256 switches. However, eAP only needs 168×96×96.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific tenus) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed:

1. A finite state machine circuit comprising:
a plurality of rows of gain cell embedded Dynamic Random Access Memory (GC-eDRAM) cells configured to store state information representing all N states expressed by a finite state machine circuit; and
a number of eDRAM switch cells, electrically coupled to the plurality of rows of the GC-eDRAM cells, the number of eDRAM switch cells arranged in an M×M cross-bar array where M is less than N, the number of eDRAM switch cells being, configured to provide interconnect for all transitions between the all N states expressed by the finite state machine circuit.

2. The finite state machine circuit of claim 1 wherein each eDRAM switch cell is configured to programmably store respective interconnect data associated with at least one transition between two states of the all N states expressed by the finite state machine circuit.

3. The finite state machine circuit of claim 2 wherein each eDRAM switch cell comprises a non-destructive read memory cell configured to maintain the respective interconnect data stored therein subsequent to a read of the non-destructive read memory cell without an intervening re-write of the non-destructive read memory cell.

4. The finite state machine circuit of claim 3 wherein each non-destructive read memory cell is configured to output a portion of potential next state information of the finite state machine circuit responsive to a portion of active state information of the finite state machine circuit.

5. The finite state machine circuit of claim 1 wherein the M×M cross-bar array comprises a reduced cross-bar array of the number of eDRAM switch cells relative to a full cross-bar array.

6. The finite state machine circuit of claim 1 wherein each eDRAM switch cell comprises a 2T1D cell.

7. The finite state machine circuit of claim 1 wherein the plurality of rows are configured to store the state information representing all N states expressed by the finite state machine circuit if the M×M cross-bar array is sufficient size to store the interconnect for all the transitions between the all N states expressed by the finite state machine circuit.

8. The finite state machine circuit of claim 7 further comprising:
wherein the plurality of rows are re-configured to store all the transitions between the all N states expressed by the finite state machine circuit if the M×M cross-bar array is insufficient size to store the interconnect for all the transitions between the all N states expressed by the finite state machine circuit.

9. The finite state machine circuit of claim 1 wherein an operational mode of the finite state machine circuit is set to finite state machine mode, the finite state machine circuit further comprising:
wherein the plurality of rows are re-configured to store non-state information if the operational mode of the finite state machine circuit is set to non-finite state machine mode.

10. The finite state machine circuit of claim 1 wherein an output of a first eDRAM switch cell is wire or'ed to output of a second eDRAM switch cell.

11. The finite state machine circuit of claim 1 wherein each of the number of eDRAM switch cells is located on a respective portion of a substrate associated with a respective one of intersections of M rows and M columns included in the M×M cross-bar array.

12. The finite state machine circuit of claim 11 wherein routing of a number of signals through the respective portion of the substrate associated with the respective one of intersections of M rows and M columns is limited to a maximum of 3.

13. A finite state machine circuit comprising:
a plurality of rows of gain cell embedded Dynamic Random Access Memory (GC-eDRAM) cells configured to store state information representing all N states expressed by a finite state machine circuit; and
a number of eDRAM switch cells electrically coupled to the plurality of rows of the GC-eDRAM cells, the number of eDRAM switch cells being about 7 times less than $N^2$ wherein the number of eDRAM switch cells configured to provide interconnect, for all transitions between the all N states expressed by the finite state machine circuit.

14. The finite state machine circuit of claim 13 wherein each eDRAM switch cell is configured to programmably store respective interconnect data associated with at least one transition between two states of the all N states expressed by the finite state machine circuit.

15. The finite state machine circuit of claim 13 wherein the 14% of $N^2$ eDRAM switch cells are arranged in an M×M cross-bar array where M is less than N and the M×M cross-bar array comprises a reduced cross-bar array of the eDRAM switch cells relative to a full cross-bar array of $N^2$.

16. The finite state machine circuit of claim 13 wherein each eDRAM switch cell comprises a 2T1D cell.

17. A finite state machine circuit comprising:
a plurality of rows of embedded gain cell Dynamic Random Access Memory (GC-eDRAM) cells configured to store state information representing all N states expressed by a finite state machine circuit in a first state machine operational mode and to provide interconnect for all transitions between the all N states expressed by the finite state machine circuit in a second state machine operational mode, wherein the finite state machine circuit further comprises:
a number of eDRAM switch cells, electrically coupled to the plurality of rows of the GC-eDRAM cells, the number of eDRAM switch cells arranged in an M×M cross-bar array where M is less than N, the number of eDRAM switch cells being configured to provide interconnect for all transitions between the all N states expressed by the finite state machine circuit in the first state machine operational mode.

18. The finite state machine circuit of claim 17 wherein the plurality of rows are re-configured to store all the transitions between the all N states expressed by the finite state machine circuit if the M×M cross-bar array is insufficient size to store the interconnect for all the transitions between the all N states expressed by the finite state machine circuit.

* * * * *